(12) United States Patent
Tang

(10) Patent No.: US 8,115,813 B2
(45) Date of Patent: Feb. 14, 2012

(54) OPTICAL SYSTEM FOR CAPTURING IMAGES

(75) Inventor: Pei-Chong Tang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 453 days.

(21) Appl. No.: 12/429,197

(22) Filed: Apr. 24, 2009

(65) Prior Publication Data

US 2009/0268081 A1    Oct. 29, 2009

(30) Foreign Application Priority Data

Apr. 28, 2008  (CN) .......................... 2008 1 0301360

(51) Int. Cl.
*H04N 7/18* (2006.01)
(52) U.S. Cl. ..................... 348/159; 348/92; 348/211.11; 348/262
(58) Field of Classification Search ................. 396/325; 348/359, 153, 154, 159, 211.11, 262, 218.1, 348/92; 356/611, 612
See application file for complete search history.

(56) References Cited

U.S. PATENT DOCUMENTS

| 5,289,261 A | * | 2/1994 | Yogo et al. ................... 356/611 |
| 5,347,363 A | * | 9/1994 | Yamanaka .................... 356/611 |
| 5,696,591 A | | 12/1997 | Bilhorn et al. |

FOREIGN PATENT DOCUMENTS

EP    1312892 A1 *  5/2003

OTHER PUBLICATIONS

Teuchert, Wolf D., Dr., (EP 1 312 892 A1), May 21, 2003; WIPO-Google German-to-English translation of disclosure.*

* cited by examiner

*Primary Examiner* — Clayton E Laballe
*Assistant Examiner* — Warren Fenwick
(74) *Attorney, Agent, or Firm* — Altis Law Group, Inc.

(57) ABSTRACT

An optical system includes a first set of cameras and a second set of cameras, and an optical assembly. The first set of cameras receive first light originating from each of a set of first portions of a printed circuit board. The first light transmits along a first optical path defined between each of the set of first portions and each of the first set of cameras. The second set of cameras receive second light originating from each of a set of second portions of the printed circuit board. The second light travels along a second optical path defined between each of the set of second portions and each of the second set of cameras. The optical assembly is capable of directing the first light and the second light toward the first set of cameras and the second between the printed circuit board respectively.

15 Claims, 7 Drawing Sheets

OPTICAL SYSTEM FOR CAPTURING IMAGES

BACKGROUND

1. Technical Field

The present disclosure generally relates to optical systems, and particularly to an optical system for capturing images used for defect analysis and inspection.

2. Description of Related Art

In the manufacture of PCBs, surface mount components, such as resistors and capacitors, are commonly mounted on the PCBs using surface mount technology (SMT). SMT generally includes depositing solder paste on conductive pads located on a PCB.

Manufacturing defects are common during the solder paste deposition process. If too much solder paste is deposited, one or more of the conductive pads on the PCB may lead to unwanted electrical connection with another nearby conductive pad on the PCB. If too little solder paste is deposited, poor mechanical and electrical connection might be established between one or more of the conductive pads on the PCB and the corresponding pads on surface mount components. Therefore, it is important to inspect the solder paste following the solder deposition process to determine whether the solder paste has been properly deposited.

Referring to FIG. 7, an optical system 20, used in a related art, includes multiple cameras 10. The multiple cameras 10 are positioned in a line for capturing images of corresponding portions of a printed circuit board (PCB) 200. Due to limited field of view of each camera 10, the multiple cameras 10 always need to be shifted along the line to capture a set of first portions 102 and a set of second portions 104. Thus, time is wasted for moving the multiple cameras 10.

Therefore, it is desired to provide an optical system to overcome the above-described shortcomings and deficiencies.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Generally, the present disclosure discloses various embodiments of an optical system, with appropriate optical configurations, for capturing images by at least two sets of multiple cameras. Comparing to the related art, the multiple cameras of the present disclosure need not be moved. The captured images are used for performing defects analysis and inspection. More details will be described hereinafter.

Figure 1:
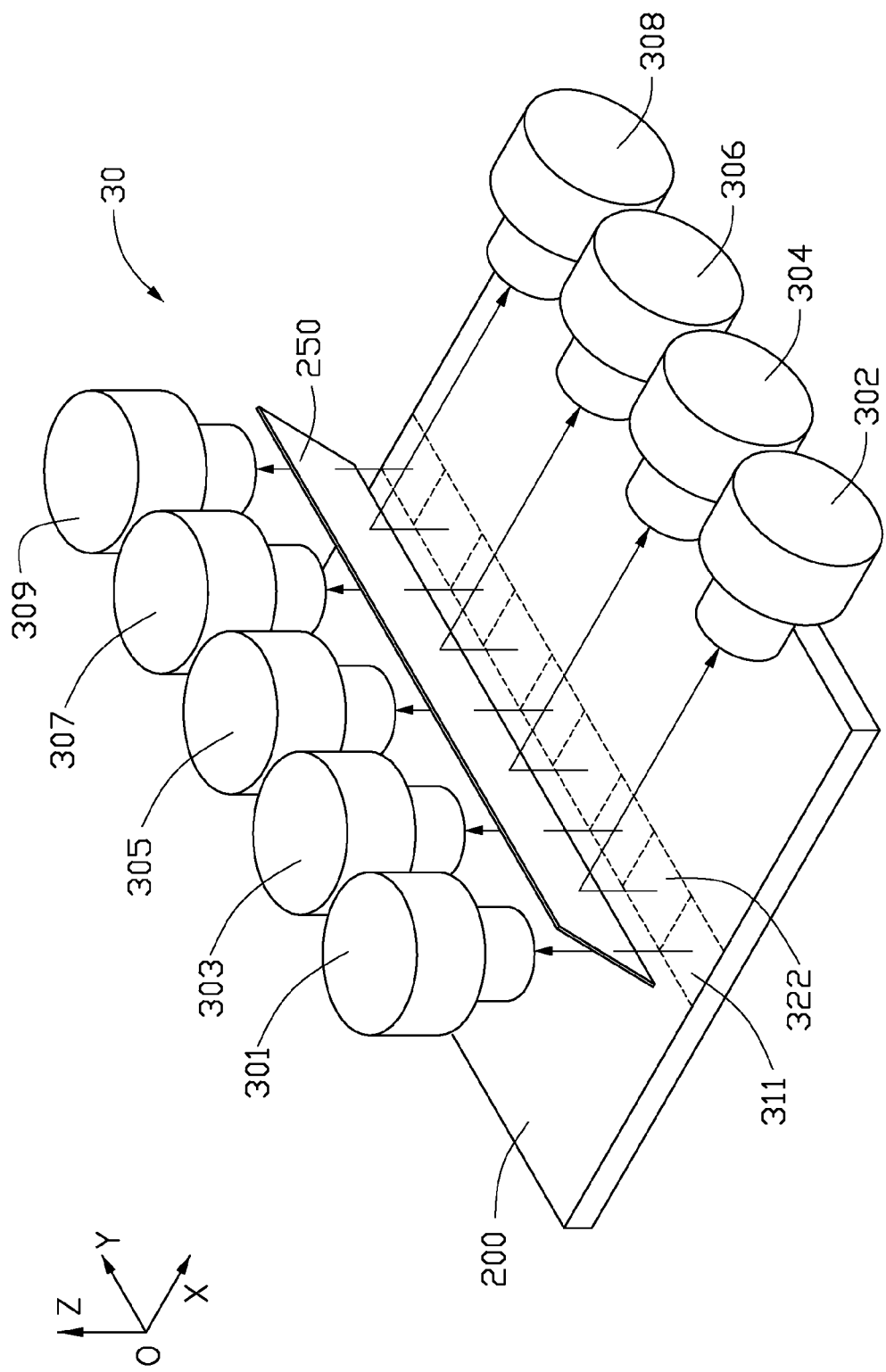
FIG. 1 is a perspective view of an optical system in accordance with a first exemplary embodiment.

Referring to FIG. 1, a first optical system 30 in accordance with a first embodiment is illustrated. The first optical system 30 is configured to capture images of a printed circuit board (PCB) 200. For example, the first optical system 30 may be configured to capture images of solder paste deposited on the PCB 200, so as to analyze and inspect defects in the solder paste. The first optical system 30 includes a first set of cameras 301, 303, 305, 307, and 309, a second set of cameras 302, 304, 306, and 308, and a first optical assembly 250.

The first set of cameras 301, 303, 305, 307, and 309 are positioned at a distance above the PCB 200. The PCB 200 defines a width side along the direction O-Y and a length side along the direction O-X (see FIG. 1). The first set of cameras 301, 303, 305, 307, and 309 are arranged linearly parallel to the width side O-Y of the PCB 200. Each of the first cameras 301, 303, 305, 307, and 309 has a limited field of view, and defines a first imaging direction O-Z for receiving light. As used herein, the term "first imaging direction" may refer to a direction perpendicular to a sensing plane of a CCD sensor or a CMOS sensor employed in the first set of cameras 301, 303, 305, 307, and 309. In the embodiment, the first imaging direction O-Z is arranged perpendicular to the plane of the PCB 20.

The second set of cameras 302, 304, 306, and 308 are also positioned at a distance above the PCB 200, and are also arranged linearly parallel to the wide side O-Y of the PCB 200. Moreover, the second set of cameras 302, 304, 306, and 308 are spaced apart from the first set of cameras 301, 303, 305, 307, and 309. The second set of cameras 302, 304, 306, and 308 are positioned at a distance from the first set of cameras 301, 303, 305, 307, and 309 along the O-X direction. Each of the second cameras 302, 304, 306, and 308 has a limited field of view, and defines a second imaging direction O-X for receiving light. As used herein, the term "second imaging direction" may refer to a direction perpendicular to a sensing plane of a CCD sensor or a CMOS sensor employed in the second set of cameras 302, 304, 306, and 308. In the embodiment, the second imaging direction O-X is arranged perpendicular to the first image direction O-Z, and perpendicular to the width direction O-Y of the PCB 200.

In the first embodiment, the first optical assembly 250 is constructed with alternatively formed transmission portions and reflective portions. The first optical assembly 250 is positioned between a first optical path defined between the set of the first cameras 301, 303, 305, 307, and 309 and the PCB 200, and between a second optical path defined between the second set of cameras 302, 304, 306, and 308 and the PCB 200. The first optical assembly 250 includes a reflecting surface facing the second set of cameras 302, 304, 306, and 308, and a transmission surface facing the first set of cameras 301, 303, 305, 307, and 309. With this configuration, most of the light originating from a first portion 311 of the PCB 200 travels through the corresponding transmission portion of the optical assembly 250, and are received by the first set of cameras 301, 303, 305, 307, and 309. Most of the light originating from a second portion 322 of the PCB 200 are reflected by the corresponding reflective portion, and are received by the second set of cameras 302, 304, 306, and 308.

In other embodiments, the first optical assembly 250 may be constructed to be a half mirror. "Half mirror" is an optical element, also known as 50/50 mirror, which is constructed to be 50% transmissive and 50% reflective. In this way, half of the light projected onto a half mirror is reflected, while half of the light travels through. With this configuration, half of the light originating from a first portion 311 of the PCB 200 travels through the half mirror 250 directly, and travels along the first imaging direction O-Z. The light traveling along the first imaging direction O-Z are received by the first set of cameras 301, 303, 305, 307, and 309, such that images of the first portions 311 are captured. Furthermore, half of the light originating from a second portion 322 of the PCB 200 are reflected by the half mirror 250, and travels along the second imaging direction O-X. The light traveling along the second imaging direction O-X are received by the second set of cameras 302, 304, 306, and 308, such that images of the second portions 322 are captured. It should be noted that, in other embodiments, the half mirror 250 may be 60% transmissive and 40% reflective to light.

In operation, the first set of cameras 301, 303, 305, 307, and 309 and the second set of cameras 302, 304, 306, and 308 simultaneously capture images of different portions of the PCB 200. Because the second set of cameras 302, 304, 306, and 308 are arranged to capture different portions of the PCB 200 simultaneously with the first set of cameras 301, 303, 305, 307, and 309. Therefore, much time is saved and the efficiency is improved.

Figure 2:
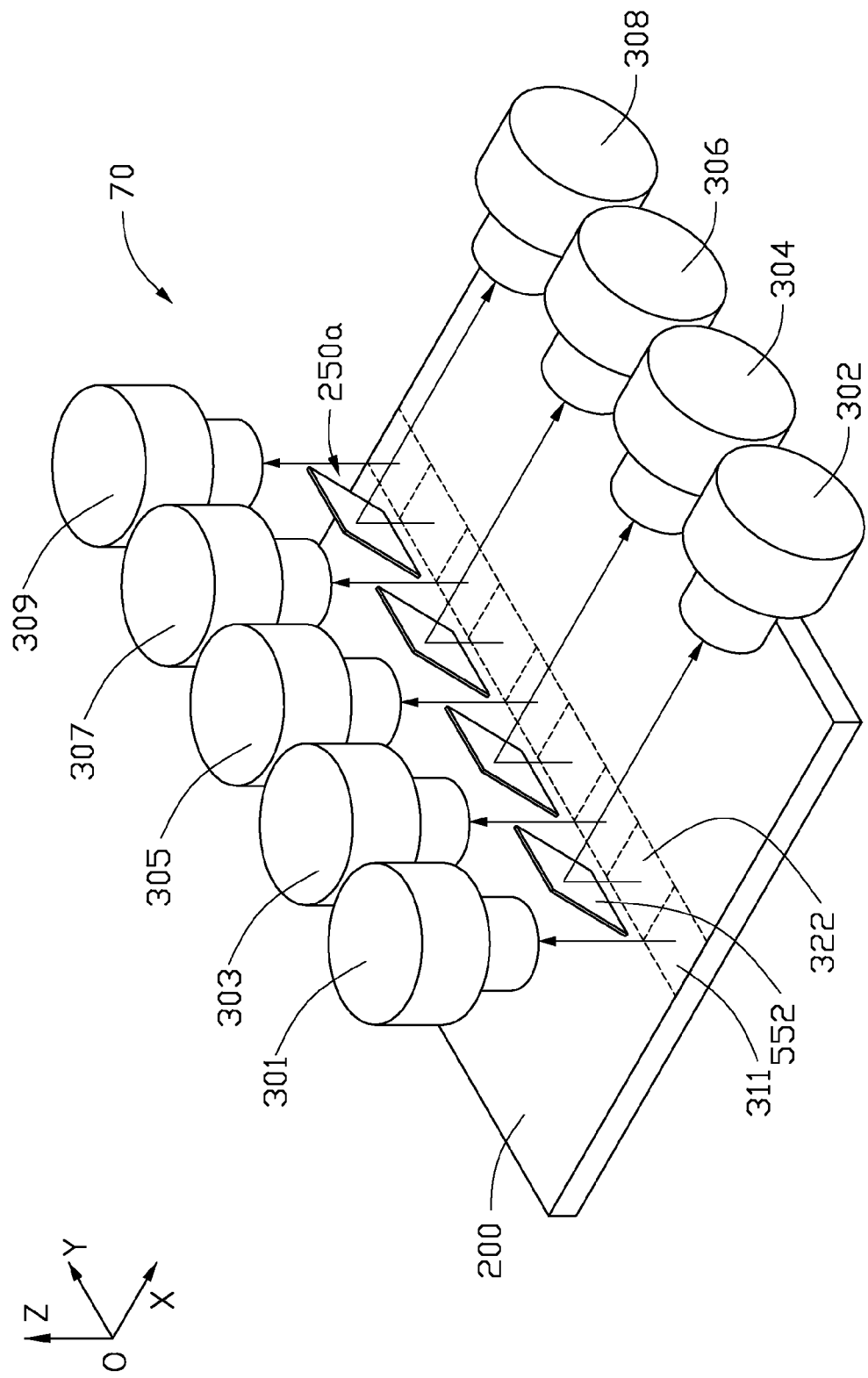
FIG. 2 is a perspective view of an optical system in accordance with a second exemplary embodiment.

Referring to FIG. 2, a second optical system 70 in accordance with a second embodiment is illustrated. In the second embodiment, the first set of cameras 301, 303, 305, 307, and 309 and the second set of cameras 302, 304, 306, and 308 have similar configurations with that of the first optical system 30 of FIG. 1. In the second embodiment, a second optical assembly 250a including a plurality of reflecting mirrors 552 is employed. The plurality of reflecting mirrors 552 are positioned exclusively in the second optical path defined between the second set of cameras 302, 304, 306, and 308 and the PCB 200. A reflecting surface of each of the plurality of reflecting mirrors 552 is arranged to face each of the second set of cameras 302, 304, 306, and 308. With this configuration, light originating from a first portion 311 of the PCB 200 are directly received by the first set of cameras 301, 303, 305, 307, and 309 without changing a light path along the first imaging direction O-Z, such that images of the first portions 311 are captured. Light originating from the second portion 322 of the PCB 200 are reflected by the plurality of reflecting mirrors 552, and travel along the second imaging direction O-X. The light traveling along the second imaging direction O-X are received by the second set of cameras 302, 304, 306, and 308, such that images of the second portions 322 are captured.

Figure 3:
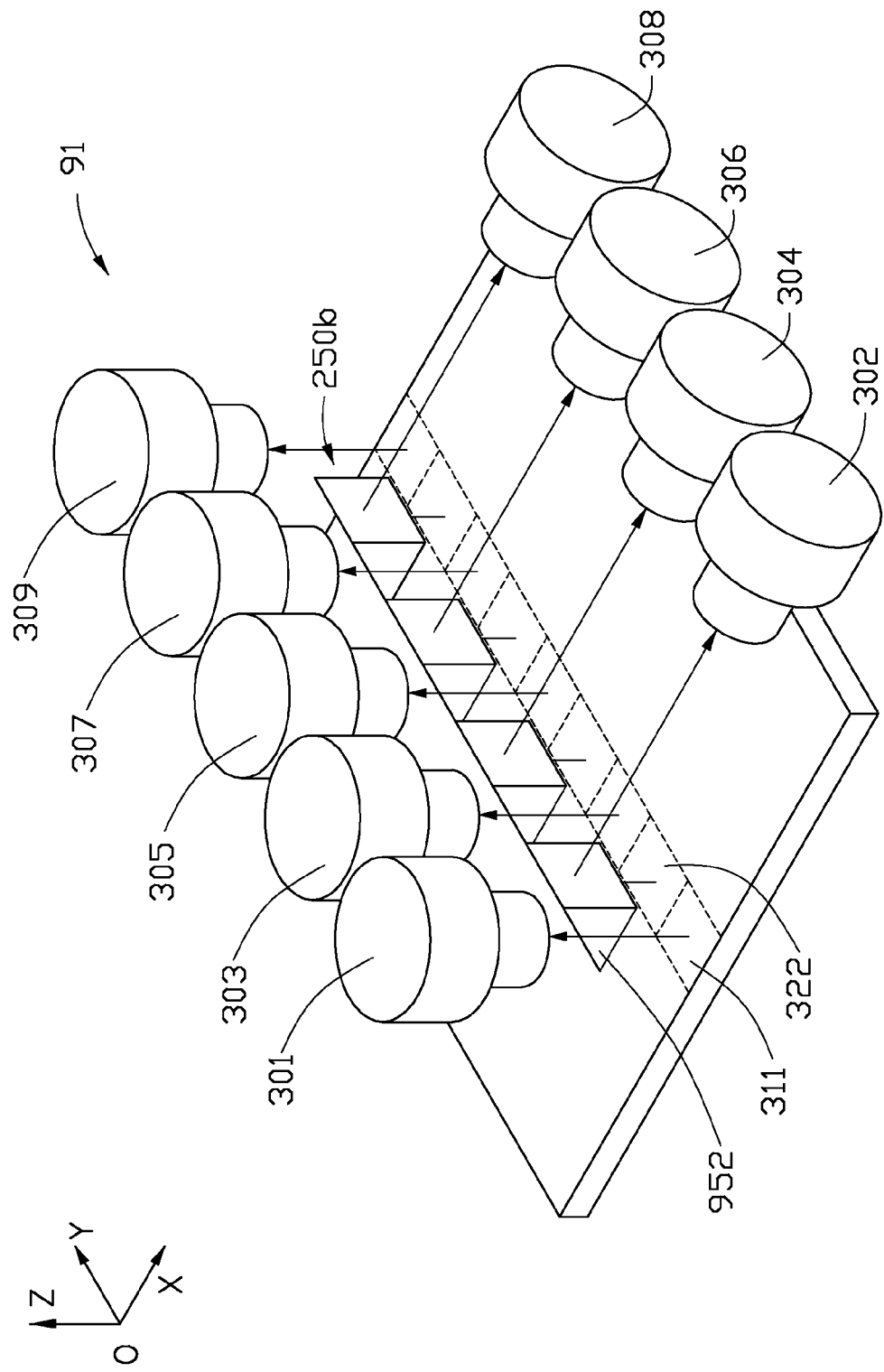
FIG. 3 is a perspective view of an optical system in accordance with a third exemplary embodiment.

Referring to FIG. 3, a third optical system 91 in accordance with a third embodiment is illustrated. In the third embodiment, the first set of cameras 301, 303, 305, 307, and 309 and the second set of cameras 302, 304, 306, and 308 have similar configurations with that of the first optical system 30 of FIG. 1 and the second optical system 70 of FIG. 2. In the third embodiment, a third optical assembly 250b including a plurality of total reflective prisms 952 are employed replacing the plurality of reflecting mirrors 552 in FIG. 2. The total reflective prism has a higher reflectivity than the reflecting mirror. Because the light originating from the second portion 322 is totally received by the second set of cameras 302, 304, 306, and 308, thus, an image of the second portion 322 captured by the third optical system 91 may be clearer than that of the second optical system 70.

Figure 4:
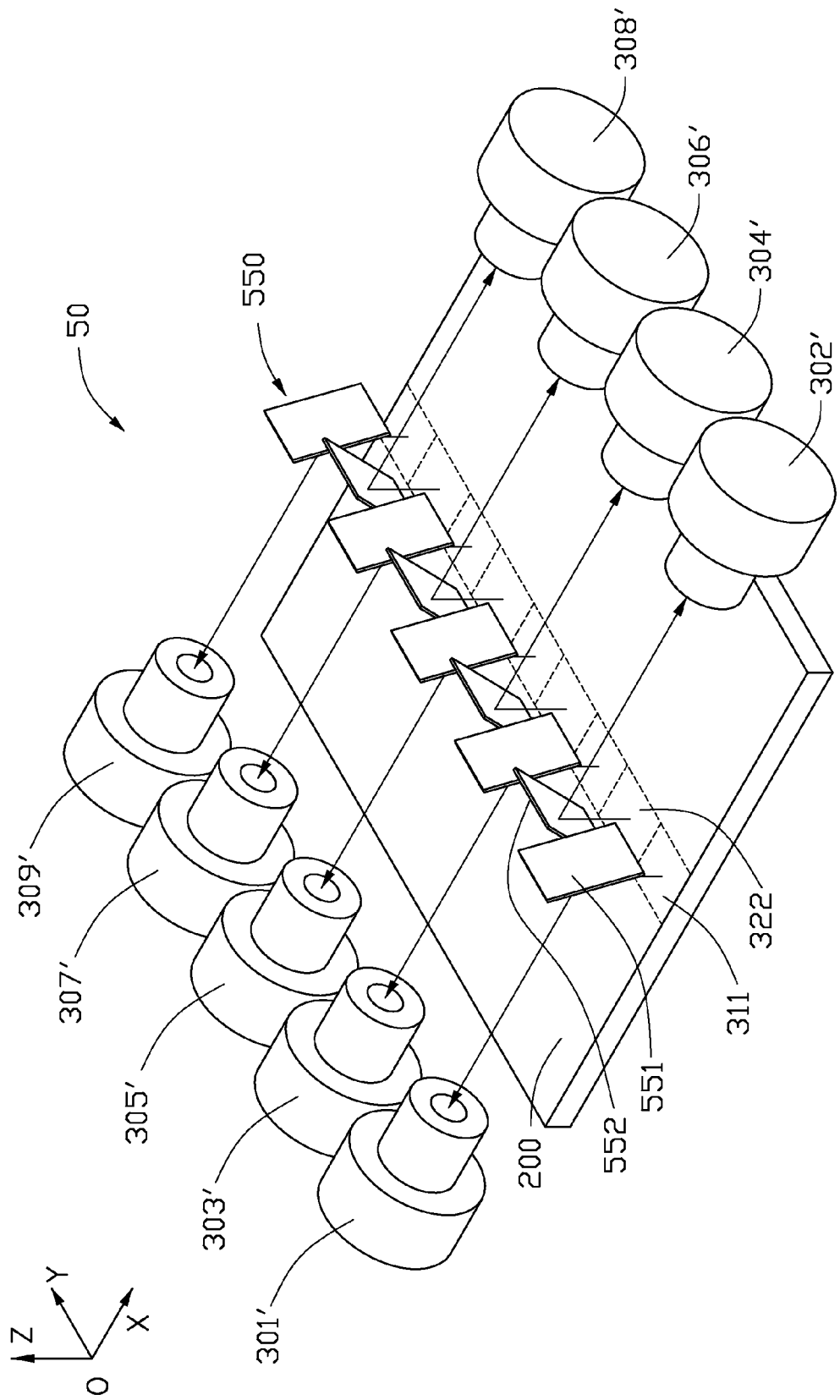
FIG. 4 is a perspective view of an optical system in accordance with a fourth exemplary embodiment.

Referring to FIG. 4, a fourth optical system 50 in accordance with a fourth embodiment is illustrated. In the fourth embodiment, the second set of cameras 302', 304', 306', and 308' have similar configurations with that of the first optical system 30 of FIG. 1, the second optical system 70 of FIG. 2, and the third optical system 91 of FIG. 3. Each of the first set of cameras 301', 303', 305', 307', and 309' is arranged to have its first imaging direction along O-X. The first imaging direction O-X is parallel to the plane of the PCB 200, and is parallel to the second imaging direction of each of the second set of cameras 302, 304, 306, and 308.

In the fourth embodiment, the fourth optical system 50 further includes a fourth optical assembly 550 having a plurality of first reflecting mirrors 551 and a plurality of second reflecting mirrors 552. A reflecting surface of each of the plurality of first reflecting mirrors 551 is arranged to face each of the first set of cameras 301', 303', 305', 307', and 309'. In the fourth embodiment, the reflecting surface of each of the plurality of first reflecting mirrors 551 forms an angle of 45° with the plane of the PCB 200. As such, light originating from a first portion 311 of the PCB 200 are reflected by the first reflecting mirror 551, and traveling along the first imaging direction O-X. The light traveling along the first imaging direction O-X are received by the first set of cameras 301', 303', 305', 307', and 309', such that images of the first portions 311 are captured. A reflecting surface of each of the plurality of second reflecting mirrors 552 is arranged to face each of the second set of cameras 302', 304', 306', and 308'. In the fourth embodiment, the reflecting surface of each of the plurality of second reflecting mirrors 552 also forms an angle of 45° with the plane of the PCB 200. As such, light originating from a second portion 322 of the PCB 200 is reflected by the second reflecting mirror 552, and traveling along the second imaging direction O-X. The light traveling along the second imaging direction O-X are received by the second set of cameras 302, 304, 306, and 308, such that images of the second portions 322 are captured.

Figure 5:
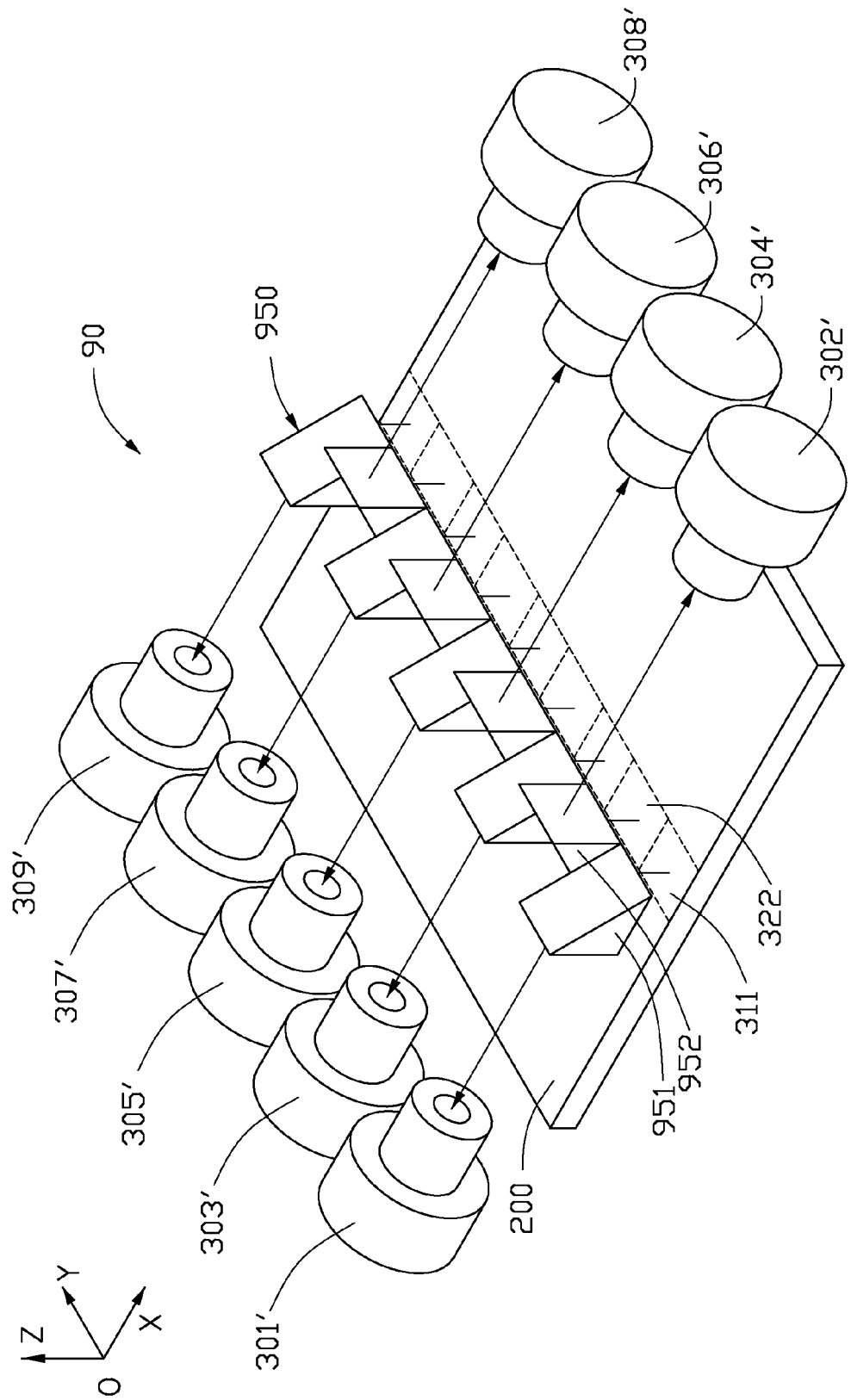
FIG. 5 is a perspective view of an optical system in accordance with a fifth exemplary embodiment.

Referring to FIG. 5, a fifth optical system 50 in accordance with a fifth embodiment is illustrated. In the fifth embodiment, a fifth optical assembly 950 including a plurality of first reflective prisms 951 and a plurality of second reflective prisms 952 are employed to replace the plurality of first reflecting mirrors 551 and the plurality of second reflecting mirrors 552 in FIG. 4 respectively. Light originating from the first portions 311 and the second portions 322 are reflected by the first reflective prisms 951 and the second reflective prisms 952 respectively. The light reflected by the first reflective prisms 951 and the second total reflective prisms 952 are received by the first set of cameras 301, 303, 305, 307, and 309 and the second set of cameras 302, 304, 306, and 308 respectively. Because the light originating from the PCB 200 is totally received by the cameras, thus, an image of the PCB 200 may be captured clearer than that of the fourth embodiment.

Figure 6:
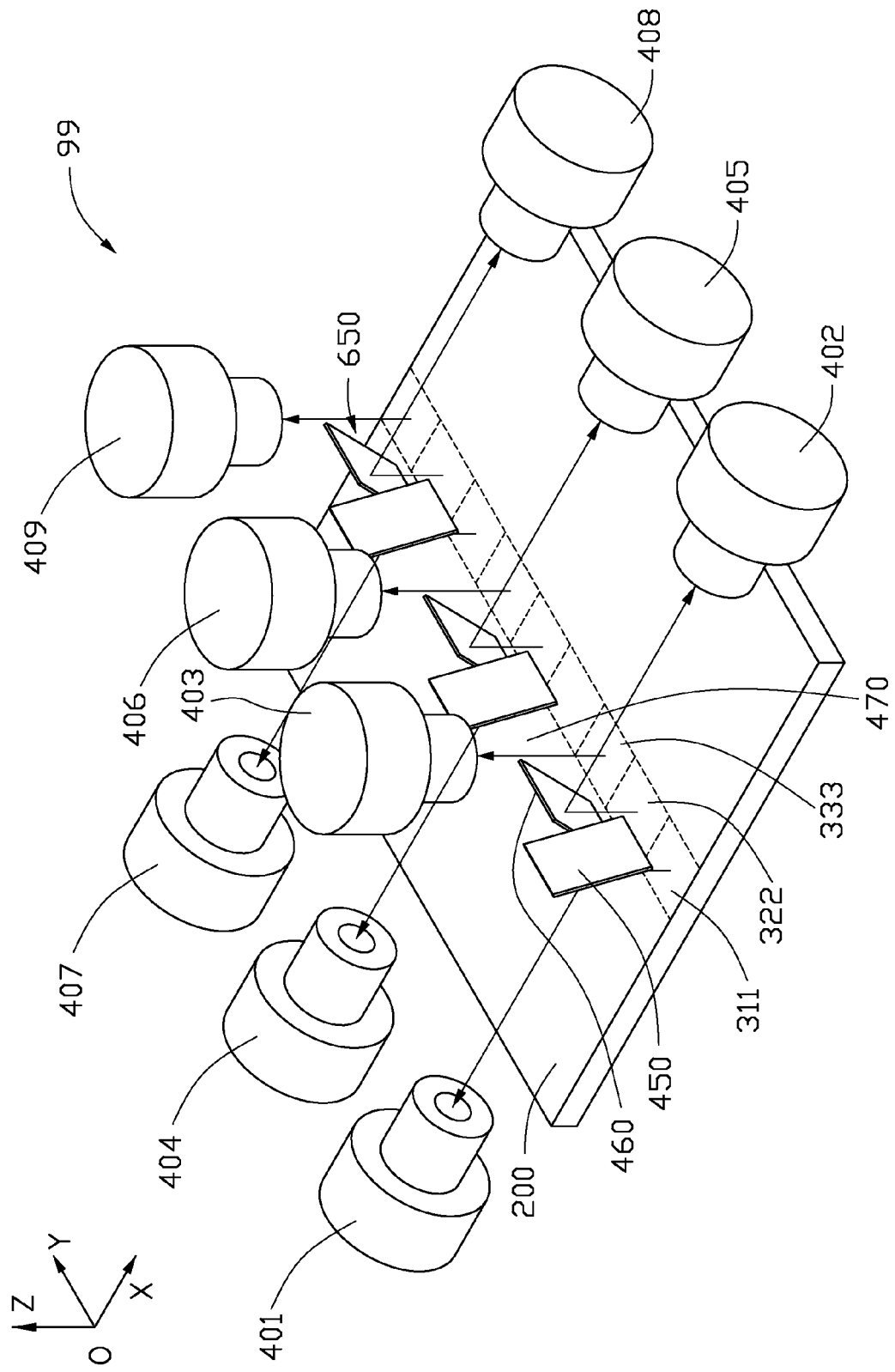
FIG. 6 is a perspective view of an optical system in accordance with a sixth exemplary embodiment.
Figure 7:
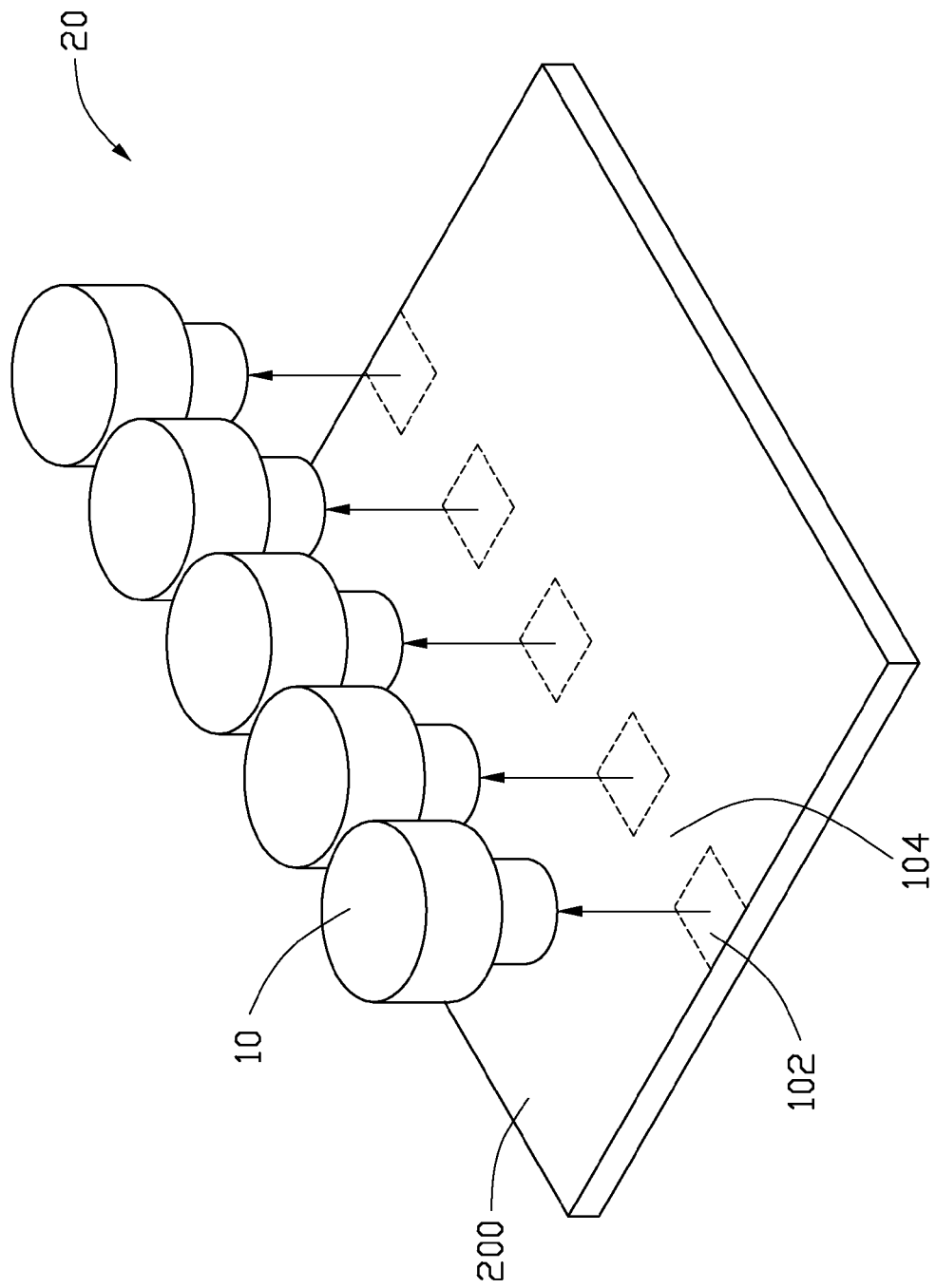
FIG. 7 is a perspective view of an optical system in a related art.

Referring to FIG. 6, a sixth optical system 99 in accordance with a sixth embodiment is illustrated. In the sixth embodiment, the optical system 99 includes a first set of cameras 401, 404, and 407, a second set of cameras 402, 405, and 408, a third set of cameras 403, 406, and 409, and a sixth optical assembly 650. The first set of cameras 401, 404, and 407, the second set of cameras 402, 405, and 408 have similar configurations with that of the fourth optical system 50 of FIG. 4 and the fifth optical system 90 of FIG. 5. The sixth optical assembly 650 includes a plurality of first reflecting mirrors 450 and a plurality of second reflecting mirrors 460. The first set of cameras 401, 404, and 407 receives light originating from the first portion 311, and reflected by the first reflecting mirror 450. The second set of cameras 402, 405, and 408 receives light originating from the second portion 322, and reflected by the second reflecting mirror 460. Light originating from a third portion 333 of the PCB 200 are directly received by the third set of cameras 403, 406, and 409 without changing a optical path along the third imaging direction O-Z, such that images of the third portions 333 are captured.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An optical system for capturing images of a printed circuit board having a set of first portions and a set of second portions, comprising:

a first set of cameras arranged in a first linear array, each of the first set of cameras configured to receive first light originating from each of the set of first portions of the printed circuit board, the first light transmitting along a first optical path defined between each of the set of first portions and each of the first set of cameras correspondingly;

a second set of cameras arranged in a second linear array, each of the second set of cameras configured to receive second light originating from each of the set of second portions of the printed circuit board, the second light transmitting along a second optical path defined between each of the set of second portions and each of the second set of cameras correspondingly; and an optical assembly disposed along at least one of the first optical path and the second optical path, the optical assembly operable to direct the first light and the second light toward the first set of cameras and the second set of cameras between the printed circuit board respectively;

wherein the optical assembly comprises a set of first reflectors and a set of second reflectors, each of the set of first reflectors reflects the first light to each of the first set of cameras, and each of the set of second reflectors reflects the second light to each of the second set of cameras, the set of first reflectors and the set of second reflectors are selected from the group consisting of reflecting mirrors and total reflective prisms.

2. The optical system according to claim 1, wherein the optical assembly is an integrally formed reflecting mirror, the reflecting mirror directly transmits the first light originating from each of the set of first portions to each of the first set of cameras, and the reflecting mirror reflects the second light originating from each of the set of second portions to each of the second set of cameras.

3. The optical system according to claim 1, wherein the optical assembly is constructed with alternatively formed transmission portions and reflective portions, the transmission portions totally transmits the first light originating from each of the set of first portions to each of the first set of cameras, the reflective portions totally reflects the second light originating from each of the set of second portions to each of the second set of cameras.

4. The optical system according to claim 1, further comprising a third set of cameras, the third set of cameras receives third light transmitted from a set of third portion of the printed circuit board without changing a transmitting direction along a third direction.

5. An optical system for capturing images of a printed circuit board, comprising:

a plurality of first cameras arranged in a line array, each of the plurality of first cameras defining a first imaging direction, allowing light originating from the printed circuit board to be transmitted directly to each of the plurality of first cameras;

a plurality of second cameras arranged in a line array and placed apart from the plurality of first cameras, each of the plurality of second cameras defining a second imaging direction, allowing light originating from the printed circuit board to be transmitted directly to each of the plurality of second cameras; and an optical assembly disposed at least in one of the first imaging direction and the second imaging direction, the optical assembly receiving light originating from the printed circuit board, at least changing a transmitting direction of a portion of the light, and directing a first portion of the light in the first imaging direction to the plurality of first cameras and a second portion of the light in the second imaging direction to the plurality of second cameras;

wherein the optical assembly includes a plurality of first reflectors and a plurality of second reflectors, the plurality of first reflectors and the plurality of second reflectors are separately disposed, the plurality of first reflectors are capable of reflecting the first portion of light originating from the printed circuit board to the plurality of first cameras in the first imaging direction, the plurality of second reflectors are capable of reflecting the second portion of light originating from the printed circuit board to the plurality of second cameras in the second imaging direction, the plurality of first reflectors and the plurality of second reflectors are selected from the group consisting of reflecting mirrors and total reflective prisms.

6. The optical system according to claim 5, wherein the first imaging direction is perpendicular to the second imaging direction.

7. The optical system according to claim 6, wherein the optical assembly is an integrally formed reflecting mirror, the reflecting mirror directly transmits the first portion of light originating from the printed circuit board to the plurality of first cameras in the first imaging direction, and the reflecting mirror reflects the second portion of light originating from the printed circuit board to the plurality of second cameras in the second imaging direction.

8. The optical system according to claim 6, wherein the optical assembly is constructed with alternatively formed transmission portions and reflective portions, the transmission portions totally transmits the first portion of light originating from the printed circuit board to the plurality of first cameras in the first imaging direction, the reflective portions totally reflects the second portion of light originating from the printed circuit board to the plurality of second cameras in the second imaging direction.

9. The optical system according to claim 6, wherein the optical assembly includes a plurality of reflectors, the plurality of reflectors are separately disposed, and are capable of reflecting the second portion of light originating from the printed circuit board to the plurality of second cameras in the second imaging direction.

10. The optical system according to claim 6, wherein the plurality of reflectors are selected from the group consisting of reflecting mirrors and total reflective prisms.

11. The optical system according to claim 6, further comprising a plurality of third cameras, the plurality of third cameras defining a third imaging direction, allowing light originating from the printed circuit board to be transmitted directly to each of the plurality of third cameras.

12. The optical system according to claim 5, wherein the first imaging direction is parallel to the second imaging direction.

13. An optical system for capturing images of a printed circuit board having a set of first portions and a set of second portions, comprising:
- a first set of cameras arranged in a first linear array, each of the first set of cameras configured to receive first light originating from each of the set of first portions of the printed circuit board, the first light transmitting along a first optical path defined between each of the set of first portions and each of the first set of cameras correspondingly;
- a second set of cameras arranged in a second linear array, each of the second set of cameras configured to receive second light originating from each of the set of second portions of the printed circuit board, the second light transmitting along a second optical path defined between each of the set of second portions and each of the second set of cameras correspondingly; and
- an optical assembly disposed along at least one of the first optical path and the second optical path, the optical assembly operable to direct the first light and the second light toward the first set of cameras and the second set of cameras between the printed circuit board respectively;
- wherein each of the first set of cameras receives the first light originating from each of the set of first portions without changing a transmitting direction thereof along the first optical path, the optical assembly comprises a set of reflectors, the set of reflectors are total reflective prisms, and each of the set of reflectors reflects the second light to each of the second set of cameras.

14. The optical system according to claim 13, wherein the optical assembly is an integrally formed reflecting mirror, the reflecting mirror directly transmits the first light originating from each of the set of first portions to each of the first set of cameras, and the reflecting mirror reflects the second light originating from each of the set of second portions to each of the second set of cameras.

15. The optical system according to claim 13, wherein the optical assembly is constructed with alternatively formed transmission portions and reflective portions, the transmission portions totally transmits the first light originating from each of the set of first portions to each of the first set of cameras, the reflective portions totally reflects the second light originating from each of the set of second portions to each of the second set of cameras.

* * * * *